(12) United States Patent
Takenaka et al.

(10) Patent No.: US 12,366,613 B2
(45) Date of Patent: Jul. 22, 2025

(54) MAGNETIC DETECTION APPARATUS, MAGNETIC SENSOR, AND MAGNETIC DETECTION METHOD

(71) Applicant: Yokogawa Electric Corporation, Musashino (JP)

(72) Inventors: Kazuma Takenaka, Musashino (JP); Naoki Noguchi, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 140 days.

(21) Appl. No.: 18/214,074

(22) Filed: Jun. 26, 2023

(65) Prior Publication Data
US 2024/0012070 A1    Jan. 11, 2024

(30) Foreign Application Priority Data
Jul. 6, 2022    (JP) .................................. 2022-109277

(51) Int. Cl.
*G01R 33/00*    (2006.01)
*G01R 33/06*    (2006.01)

(52) U.S. Cl.
CPC ....... *G01R 33/0005* (2013.01); *G01R 33/063* (2013.01)

(58) Field of Classification Search
CPC .............. G01R 33/0005; G01R 33/063; G01R 33/0023; G01R 33/0041; G01R 33/0076; G01R 33/02; G01R 33/0029; G01R 27/28
(Continued)

(56) References Cited

U.S. PATENT DOCUMENTS 2,597,149 A * 5/1952 Kahan .................... G01R 33/02
                                                       324/250
5,389,875 A * 2/1995 Rosen ................ G01R 33/0325
                                                       324/228
(Continued)

FOREIGN PATENT DOCUMENTS

JP    2001-281309 A    10/2001
JP    2001-289926 A    10/2001
(Continued)

OTHER PUBLICATIONS

Extended (Supplementary) European Search Report dated Dec. 11, 2023, issued in counterpart EP Application No. 23182464.0. (11 pages).
(Continued)

*Primary Examiner* — Christopher P McAndrew
(74) *Attorney, Agent, or Firm* — WHDA, LLP

(57) ABSTRACT

A magnetic detection apparatus according to the present disclosure includes a magnetic sensor and a measurement apparatus. The magnetic sensor includes a first transmission line and a second transmission line arranged to be non-parallel to each other. The measurement apparatus includes a signal generator configured to generate a first incident wave and a second incident wave, a signal detector configured to detect a first reflected wave caused by an impedance mismatch of the first transmission line and a second reflected wave caused by an impedance mismatch of the second transmission line, and a controller. The controller calculates a first magnetic field based on the first incident wave and the first reflected wave and a second magnetic field based on the second incident wave and the second reflected wave and calculates a biaxial magnetic field based on the first magnetic field and the second magnetic field.

8 Claims, 7 Drawing Sheets

(58) Field of Classification Search
USPC .......................................................... 324/200
See application file for complete search history.

(56) References Cited

U.S. PATENT DOCUMENTS

| | | | | |
|---|---|---|---|---|
| 2002/0186033 | A1* | 12/2002 | Smith, Jr. ................. | G01F 1/28 |
| | | | | 324/750.3 |
| 2007/0040551 | A1* | 2/2007 | Ciureanu ............... | G01R 33/02 |
| | | | | 324/244 |
| 2015/0145509 | A1* | 5/2015 | Takenaka ........... | G01N 27/9046 |
| | | | | 324/207.21 |
| 2018/0372511 | A1 | 12/2018 | Shulver et al. | |
| 2021/0270915 | A1* | 9/2021 | Uemura ............. | G01R 33/0047 |
| 2021/0293858 | A1* | 9/2021 | Takahashi ................ | G01R 3/00 |
| 2021/0318396 | A1* | 10/2021 | Ohta ...................... | G01D 5/145 |
| 2021/0349162 | A1 | 11/2021 | Takenaka | |

FOREIGN PATENT DOCUMENTS

| | | | |
|---|---|---|---|
| JP | 2001-305201 | A | 10/2001 |
| JP | 2004-012262 | A | 1/2004 |
| JP | 2020-60565 | A | 4/2020 |
| JP | 2021-009049 | A | 1/2021 |
| JP | 2021-162456 | A | 10/2021 |

OTHER PUBLICATIONS

Office Action dated Feb. 12, 2025, issued in counterpart JP Application No. 2022-109277, with English translation. (10 pages).

\* cited by examiner

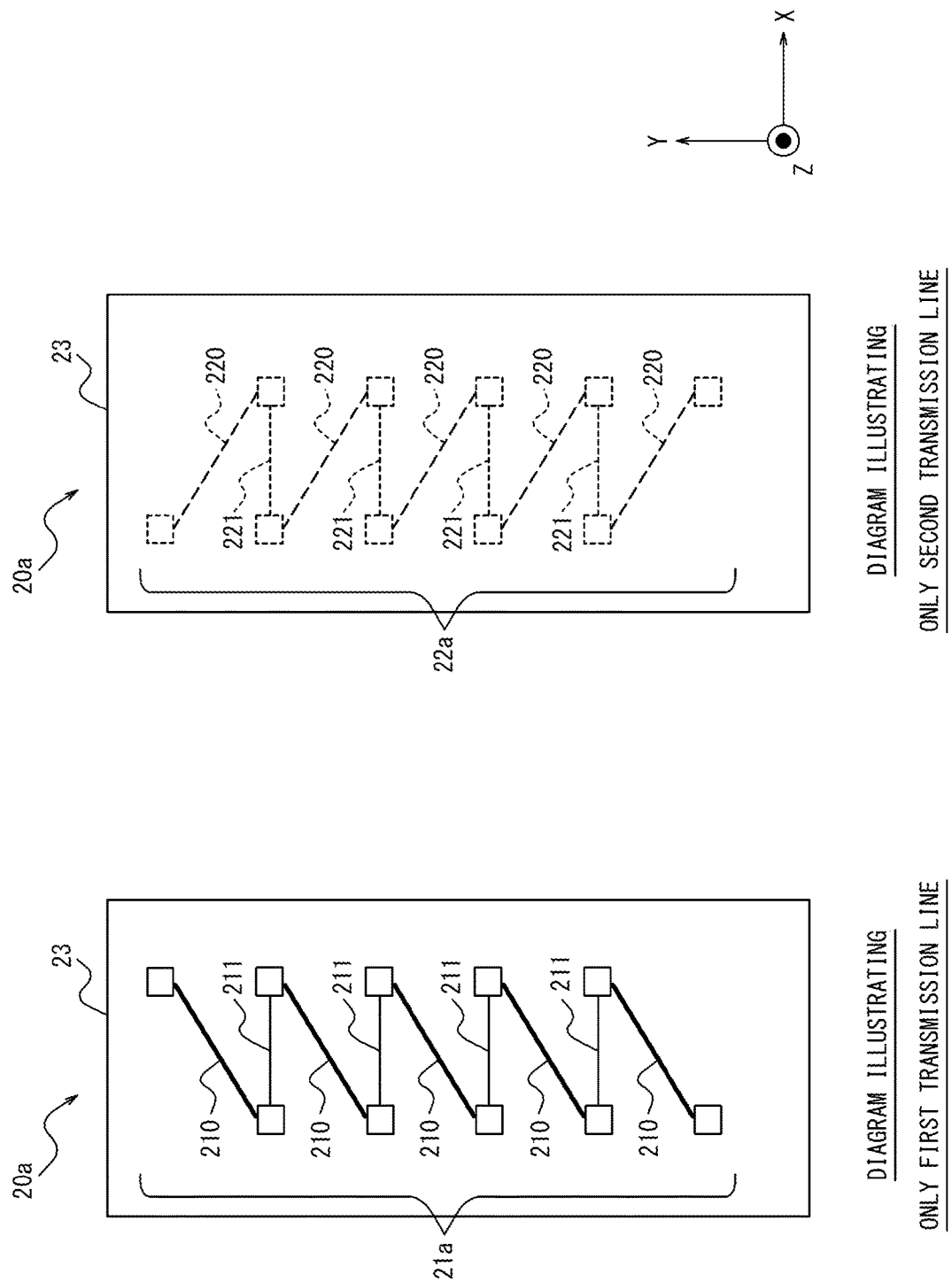

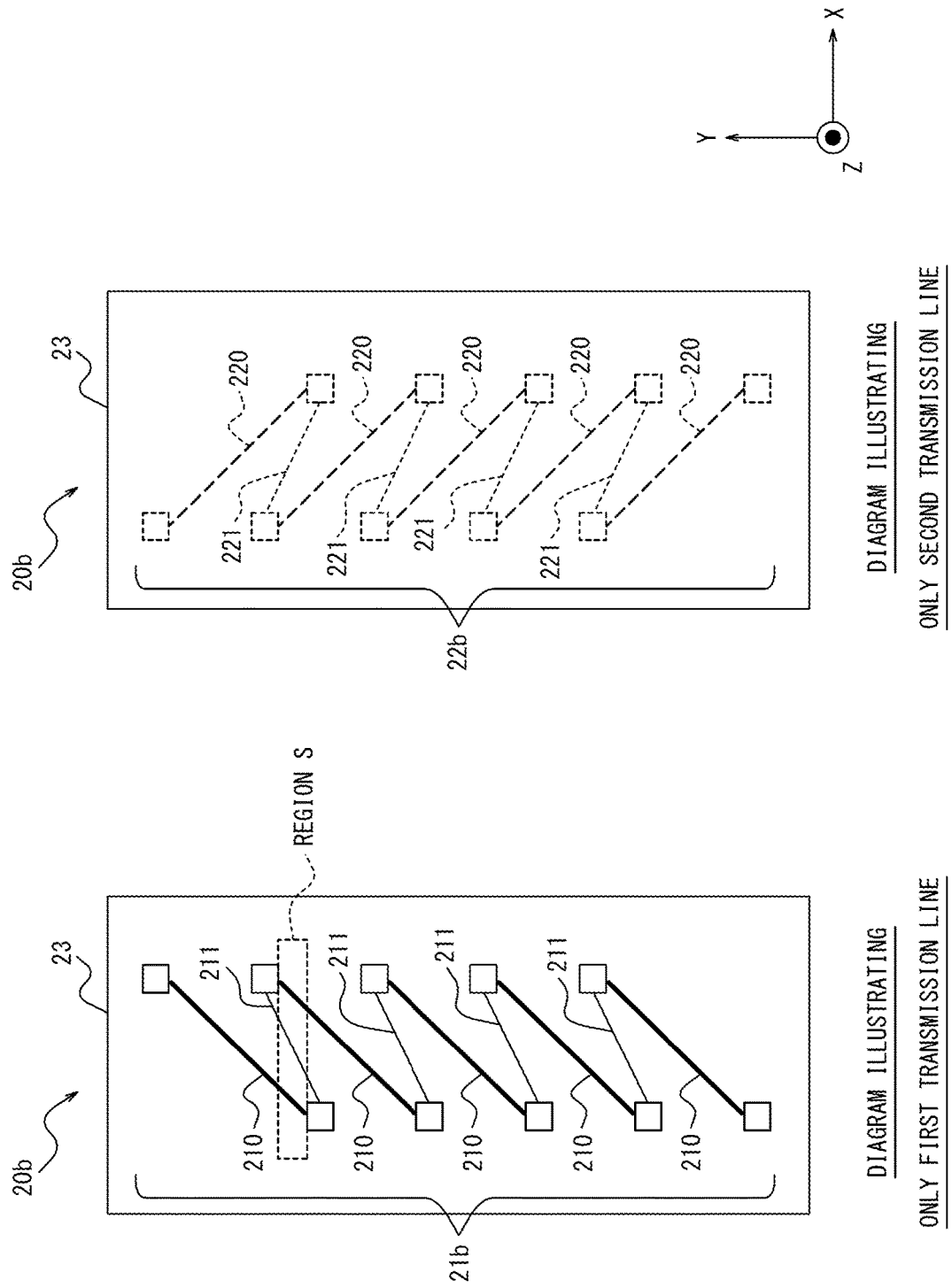

MAGNETIC DETECTION APPARATUS, MAGNETIC SENSOR, AND MAGNETIC DETECTION METHOD

CROSS-REFERENCE TO RELATED APPLICATION

The present application claims priority to Japanese Patent Application No. 2022-109277 filed on Jul. 6, 2022, the entire contents of which are incorporated herein by reference.

TECHNICAL FIELD

The present disclosure relates to a magnetic detection apparatus, a magnetic sensor, and a magnetic detection method.

BACKGROUND

Magnetic detection apparatuses capable of detecting magnetic fields are known. Magnetic detection apparatuses have various configurations.

Magnetic detection apparatuses in which the magnetic sensor that detects the magnetic field has a linear configuration are known. For example, see Patent Literature (PTL) 1 and PTL 2.

Linear magnetic sensors have the advantage of being highly flexible, allowing the magnetic sensors to be freely installed in accordance with the measurement target. In addition, the use of a linear magnetic sensor has the advantage that the magnetic field can be detected at any position along the linear magnetic sensor.

CITATION LIST

Patent Literature

PTL 1: JP 2020-60565 A
PTL 2: JP 2021-162456 A

SUMMARY

A magnetic detection apparatus according to an embodiment includes a magnetic sensor and a measurement apparatus, wherein the magnetic sensor includes at least one first transmission line including at least one linear first conductor containing magnetic material; and at least one second transmission line including at least one linear second conductor containing magnetic material, the first transmission line and the second transmission line are arranged to be non-parallel to each other, the measurement apparatus comprises a signal generator configured to generate a first incident wave to be inputted to the first transmission line and a second incident wave to be inputted to the second transmission line; a signal detector configured to detect a first reflected wave caused by an impedance mismatch of the first transmission line at a position of magnetic field application to the magnetic sensor and a second reflected wave caused by an impedance mismatch of the second transmission line at the position of magnetic field application; and a controller, and the controller is configured to calculate a first magnetic field in a direction along the first transmission line at the position of magnetic field application based on the first incident wave and the first reflected wave, calculate a second magnetic field in a direction along the second transmission line at the position of magnetic field application based on the second incident wave and the second reflected wave, and calculate a biaxial magnetic field based on the first magnetic field and the second magnetic field.

A magnetic sensor according to an embodiment includes: a first transmission line including a linear first conductor containing magnetic material; and a second transmission line including a linear second conductor containing magnetic material, wherein the first transmission line and the second transmission line are arranged to be non-parallel to each other.

A magnetic detection method according to an embodiment is for a magnetic detection apparatus including a magnetic sensor and a measurement apparatus, the magnetic sensor including a first transmission line including a linear first conductor containing magnetic material; and a second transmission line including a linear second conductor containing magnetic material, the first transmission line and the second transmission line being arranged to be non-parallel, the magnetic detection method including: generating, by the measurement apparatus, a first incident wave to be inputted to the first transmission line and a second incident wave to be inputted to the second transmission line; detecting, by the measurement apparatus, a first reflected wave caused by an impedance mismatch of the first transmission line at a position of magnetic field application to the magnetic sensor and a second reflected wave caused by an impedance mismatch of the second transmission line at the position of magnetic field application; calculating, by the measurement apparatus, a first magnetic field in a direction along the first transmission line at the position of magnetic field application based on the first incident wave and the first reflected wave; calculating, by the measurement apparatus, a second magnetic field in a direction along the second transmission line at the position of magnetic field application based on the second incident wave and the second reflected wave; and calculating, by the measurement apparatus, a biaxial magnetic field based on the first magnetic field and the second magnetic field.

BRIEF DESCRIPTION OF THE DRAWINGS

In the accompanying drawings:

FIG. 7 is a diagram illustrating a schematic configuration of a magnetic sensor according to a first variation; and FIG. 8 is a diagram illustrating a schematic configuration of a magnetic sensor according to a second variation.

DETAILED DESCRIPTION

Figure 1:
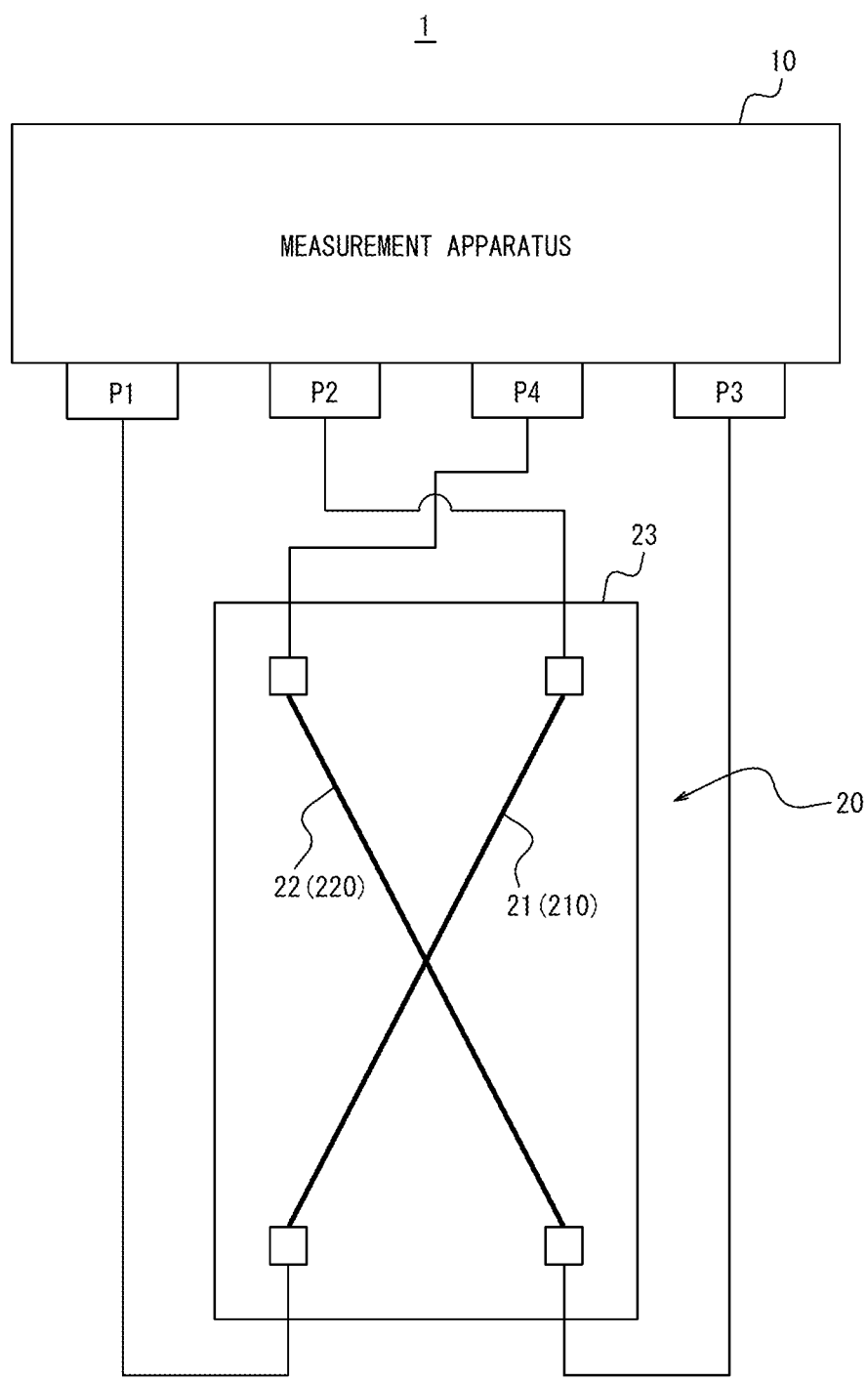
FIG. 1 is a diagram illustrating a schematic configuration of a magnetic detection apparatus according to an embodiment.

The magnetic fields detected by the magnetic detection apparatuses described in PTL 1 and 2 are magnetic fields along the longitudinal direction of the linear magnetic sensor. In other words, the magnetic detection apparatuses described in PTL 1 and 2 can detect uniaxial magnetic fields.

In magnetic detection apparatuses using linear magnetic sensors, it is desirable to be able to detect biaxial magnetic fields rather than just uniaxial magnetic fields.

It would be helpful to provide a magnetic detection apparatus, a magnetic sensor, and a magnetic detection method capable of detecting biaxial magnetic fields.

A magnetic detection apparatus according to an embodiment includes a magnetic sensor and a measurement apparatus, wherein the magnetic sensor includes at least one first transmission line including at least one linear first conductor containing magnetic material; and at least one second transmission line including at least one linear second conductor containing magnetic material, the first transmission line and the second transmission line are arranged to be non-parallel to each other, the measurement apparatus comprises a signal generator configured to generate a first incident wave to be inputted to the first transmission line and a second incident wave to be inputted to the second transmission line; a signal detector configured to detect a first reflected wave caused by an impedance mismatch of the first transmission line at a position of magnetic field application to the magnetic sensor and a second reflected wave caused by an impedance mismatch of the second transmission line at the position of magnetic field application; and a controller, and the controller is configured to calculate a first magnetic field in a direction along the first transmission line at the position of magnetic field application based on the first incident wave and the first reflected wave, calculate a second magnetic field in a direction along the second transmission line at the position of magnetic field application based on the second incident wave and the second reflected wave, and calculate a biaxial magnetic field based on the first magnetic field and the second magnetic field. According to such a magnetic detection apparatus, biaxial magnetic fields can be detected.

In a magnetic detection apparatus according to an embodiment, in the magnetic sensor, the at least one first transmission line may include a plurality of first transmission lines arranged in parallel with each other, and the at least one second transmission line may include a plurality of second transmission lines arranged in parallel with each other, and the plurality of first transmission lines and the plurality of second transmission lines may be arranged to be non-parallel to each other. Resistance loss can thereby be reduced.

In the magnetic detection apparatus according to an embodiment, the first transmission line and the second transmission line may be one of a coaxial cable, a parallel two-wire line, a strip line, a microstrip line, a coplanar line, and a waveguide. By thus configuring the first transmission line and second transmission line as coaxial cables, the first transmission line and the second transmission line can be made flexible. Also, by configuring a flexible substrate with a parallel two-wire line, strip line, microstrip line, coplanar line, or waveguide, the first transmission line and the second transmission line can be made flexible.

In a magnetic detection apparatus according to an embodiment, the at least one first conductor in the first transmission line may include a plurality of first conductors, the plurality of first conductors may be connected by at least one conductor of non-magnetic material, the first transmission line may have a serrated shape, the at least one second conductor in the second transmission line may include a plurality of second conductors, the plurality of second conductors may be connected by at least one conductor of non-magnetic material, the second transmission line may have a serrated shape, and the plurality of first conductors and the plurality of second conductors may be arranged to be non-parallel to each other. This configuration can extend the range over which the magnetic sensor can detect magnetic fields in the longitudinal direction without increasing the length of the magnetic sensor in the transverse direction and without reducing the sensitivity to the magnetic field in the transverse direction.

In the magnetic detection apparatus according to an embodiment, two adjacent first conductors among the plurality of first conductors may have an overlapping region in a longitudinal direction of the magnetic sensor, and two adjacent second conductors among the plurality of second conductors may have an overlapping region in the longitudinal direction of the magnetic sensor. This configuration can prevent the existence of regions that may be less sensitive to external magnetic fields.

The magnetic detection apparatus according to an embodiment may further include a coil configured to apply a bias magnetic field to the first transmission line and the second transmission line. With this configuration, the first magnetic field and second magnetic field can be calculated at operating points that exhibit high linearity, small hysteresis, and high sensitivity.

A magnetic sensor according to an embodiment includes: a first transmission line including a linear first conductor containing magnetic material; and a second transmission line including a linear second conductor containing magnetic material, wherein the first transmission line and the second transmission line are arranged to be non-parallel to each other. According to such a magnetic sensor, biaxial magnetic fields can be detected.

A magnetic detection method according to an embodiment is for a magnetic detection apparatus including a magnetic sensor and a measurement apparatus, the magnetic sensor including a first transmission line including a linear first conductor containing magnetic material; and a second transmission line including a linear second conductor containing magnetic material, the first transmission line and the second transmission line being arranged to be non-parallel, the magnetic detection method including: generating, by the measurement apparatus, a first incident wave to be inputted to the first transmission line and a second incident wave to be inputted to the second transmission line; detecting, by the measurement apparatus, a first reflected wave caused by an impedance mismatch of the first transmission line at a position of magnetic field application to the magnetic sensor and a second reflected wave caused by an impedance mismatch of the second transmission line at the position of magnetic field application; calculating, by the measurement apparatus, a first magnetic field in a direction along the first transmission line at the position of magnetic field application based on the first incident wave and the first reflected wave; calculating, by the measurement apparatus, a second magnetic field in a direction along the second transmission line at the position of magnetic field application based on the second incident wave and the second reflected wave; and calculating, by the measurement apparatus, a biaxial magnetic field based on the first magnetic field and the second magnetic field. According to such a magnetic detection method, biaxial magnetic fields can be detected.

According to the present disclosure, a magnetic detection apparatus, a magnetic sensor, and a magnetic detection method capable of detecting biaxial magnetic fields can be provided.

Embodiments of the present disclosure are now described with reference to the drawings.

FIG. 1 is a diagram illustrating a schematic configuration of a magnetic detection apparatus 1 according to an embodiment. The magnetic detection apparatus 1 includes a measurement apparatus 10 and a magnetic sensor 20.

The magnetic sensor 20 includes a first transmission line 21, a second transmission line 22, and a substrate 23.

The first transmission line 21 is formed on the substrate 23. The second transmission line 22 is formed on the substrate 23. The first transmission line 21 and the second transmission line 22 are formed on the substrate 23 so as not to short-circuit.

For example, the first transmission line 21 may be formed on the front surface of the substrate 23, and the second transmission line 22 may be formed on the back surface of the substrate 23. Alternatively, the first transmission line 21 may be formed on the back surface of the substrate 23, and the second transmission line 22 may be formed on the front surface of the substrate 23.

In a case in which the substrate 23 is a multilayer substrate, the first transmission line 21 and the second transmission line 22 may be formed in different layers of the substrate 23.

As illustrated in FIG. 1, the first transmission line 21 and the second transmission line 22 are arranged to be non-parallel to each other.

The substrate 23 is a flexible substrate. The substrate 23 may, for example, be a Flexible Printed Circuit (FPC).

The first transmission line 21 and the second transmission line 22 are linear transmission lines. The first transmission line 21 and the second transmission line 22 have a predetermined characteristic impedance. The first transmission line 21 and the second transmission line 22 may be formed on the substrate 23 as flexible coaxial cables. The first transmission line 21 and the second transmission line 22 may also be formed on the substrate 23 as one of a parallel two-wire line, a strip line, a microstrip line, a coplanar line, and a waveguide.

The flexibility of the first transmission line 21, the second transmission line 22, and the substrate 23 makes the magnetic sensor 20 deform easily. By virtue of being flexible, the magnetic sensor 20 can be installed freely according to the shape of the measurement target.

One end of the first transmission line 21 is connected to a port P1 of the measurement apparatus 10. The other end of the first transmission line 21 is connected to a port P2 of the measurement apparatus 10.

One end of the second transmission line 22 is connected to a port P3 of the measurement apparatus 10. The other end of the second transmission line 22 is connected to a port P4 of the measurement apparatus 10.

The first transmission line 21 includes a linear first conductor 210 containing magnetic material. The first conductor 210 functions as a signal line. In addition to the first conductor 210, the first transmission line 21 may include a shield wire configured by copper wire or the like and a dielectric that insulates the first conductor 210 and the shield wire.

The second transmission line 22 includes a linear second conductor 220 containing magnetic material. The second conductor 220 functions as a signal line. In addition to the second conductor 220, the second transmission line 22 may include a shield wire configured by copper wire or the like and a dielectric that insulates the second conductor 220 and the shield wire.

The first conductor 210 and the second conductor 220 are linear conductors containing magnetic material. The first conductor 210 and the second conductor 220 contain, for example, magnetic material that is distributed uniformly.

The first conductor 210 and the second conductor 220 may contain a soft magnetic material with low holding power and high magnetic permeability. The first conductor 210 and the second conductor 220 may, for example, contain an amorphous alloy or a permalloy.

Amorphous alloys and permalloys contain magnetic materials with high magnetic permeability. Therefore, the first transmission line 21 including the first conductor 210 and the second transmission line 22 including the second conductor 220 have high circumferential and axial permeability. Because of the high circumferential and axial permeability, when an external magnetic field is applied to the first transmission line 21 and second transmission line 22, the impedance changes due to either the magnetic impedance effect on the surface of the first conductor 210 and second conductor 220 or the magnetization (magnetic wall movement) effect inside the first conductor 210 and second conductor 220, or due to both of these effects.

For example, amorphous alloys with irregularly arranged atoms may be Fe-based amorphous alloys, such as Fe—Co—Si—B alloys (Fe-rich), Fe—Si—B—C alloys, Fe—Si—B alloys, Fe—Si—B—Nb—Cu alloys, or Fe—P—B alloys. Amorphous alloys may also be Co-based amorphous alloys, such as Fe—Co—Si—B alloys (Co-rich), Co—Fe—Cr—Si—B alloys, or Co—Fe—Mn—Cr—Si—B alloys. The amorphous alloy may be a Ni-based amorphous alloy.

Examples of permalloy, which is an alloy mainly composed of Fe and Ni, include 78-permalloy with a Ni content of 78.5% (JIS standard: permalloy A), 45-permalloy with a Ni content of 45% (40-50%) (JIS standard: permalloy B), and a permalloy yielded by adding Mo, Cu, Cr, or the like to 78-permalloy (JIS standard: permalloy C).

The volume resistivity of permalloy is approximately 68 μΩcm. This is a volume resistivity of more than 40 times the volume resistivity of copper, which is 1.68 μΩcm.

The first conductor 210 and second conductor 220 may include soft magnetic materials other than amorphous alloys and permalloys, such as Fe—Si—Al alloys (for example, sendust), Fe—Co alloys (for example, permendur), Mn—Zn alloys or Ni—Zn alloys (for example, soft ferrite), or Fe—Si alloys (for example, silicon steel or electromagnetic steel).

In a case in which the magnetic field applied to the first transmission line 21 and the second transmission line 22 is a relatively large magnetic field of approximately 10 [oersted (Oe)], the first conductor 210 and the second conductor 220 may contain a single metal such as Fe, Ni, or Co as the magnetic material.

The first conductor 210 and the second conductor 220 may include a nanocrystalline soft magnetic material with nanocrystalline grains dispersed in an amorphous phase.

Figure 2:
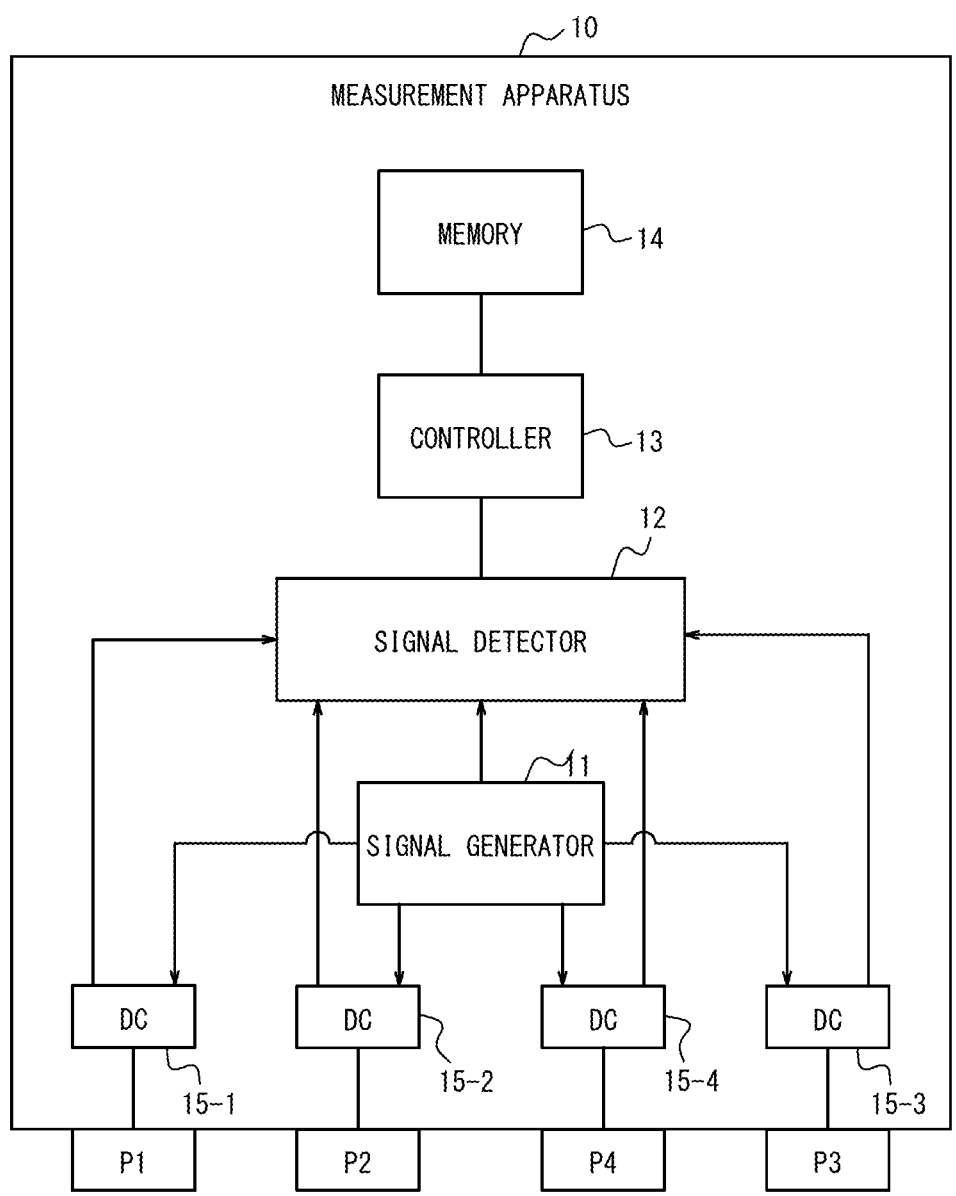
FIG. 2 is a diagram illustrating a schematic configuration of a measurement apparatus according to an embodiment.

FIG. 2 is a diagram illustrating a schematic configuration of the measurement apparatus 10 in FIG. 1. The measurement apparatus 10 includes a signal generator 11, a signal detector 12, a controller 13, a memory 14, and directional couplers (DCs) 15-1 to 15-4. The measurement apparatus 10 also includes ports P1 to P4. The ports P1 to P4 are ports for inputting and outputting signals. The measurement apparatus 10 may, for example, be a measurement apparatus that functions as a vector network analyzer.

Although the connection is not illustrated in FIG. 2, the port P1 is connected to one end of the first transmission line 21, as illustrated in FIG. 1. The port P2 is connected to the other end of the first transmission line 21. The port P3 is connected to one end of the second transmission line 22. The port P4 is connected to the other end of the second transmission line 22.

The signal generator 11 generates the incident wave that is inputted to the first transmission line 21 and the incident wave that is inputted to the second transmission line 22. Hereinafter, the incident wave inputted to the first transmission line 21 may be referred to as the "first incident wave" and the incident wave inputted to the second transmission line 22 as the "second incident wave".

As the first and second incident waves, the signal generator 11 outputs a sinusoidal signal while sweeping the frequency from 10 MHz to 50 GHz, for example.

The signal generator 11 is connected to the DCs 15-1 to 15-4 and to the signal detector 12.

The signal generator 11 outputs the generated first incident wave to the DC 15-1 to input the first incident wave to one end of the first transmission line 21 via the port P1. Alternatively, the signal generator 11 outputs the generated first incident wave to the DC 15-2 to input the first incident wave to the other end of the first transmission line 21 via the port P2.

The signal generator 11 outputs the generated second incident wave to the DC 15-3 to input the second incident wave to one end of the second transmission line 22 via the port P3. Alternatively, the signal generator 11 outputs the generated second incident wave to the DC 15-4 to input the second incident wave to the other end of the second transmission line 22 via the port P4.

The signal generator 11 outputs the generated first and second incident waves to the signal detector 12.

The signal detector 12 detects the first and second incident waves inputted from the signal generator 11. The signal detector 12 also detects reflected waves inputted from the DCs 15-1 to 15-4.

The reflected wave that is detected by the signal detector 12 is explained below. Suppose that an external magnetic field is applied at a certain position of the magnetic sensor 20. The position where the external magnetic field is applied may hereinafter be referred to as the "position of magnetic field application".

When an external magnetic field is applied at a certain position of the magnetic sensor 20, the impedance of the first transmission line 21 and the second transmission line 22 changes at the position of magnetic field application. In this state, when the first incident wave is inputted to the first transmission line 21, a reflected wave is generated due to the impedance mismatch at the position of magnetic field application. Hereinafter, the reflected wave generated in the first transmission line 21 may be referred to as the "first reflected wave". Also, when the second incident wave is inputted to the second transmission line 22 in this state, a reflected wave is generated due to the impedance mismatch at the position of magnetic field application. Hereinafter, the reflected wave generated in the second transmission line 22 may be referred to as the "second reflected wave". The "first reflected wave" and the "second reflected wave" may simply be referred to as the "reflected wave" when there is no need to distinguish between them. The "first incident wave" and "second incident wave" may also be simply referred to as the "incident wave" when there is no need to distinguish between them.

For example, in a case in which the signal generator 11 outputs the first incident wave to the DC 15-1, the first incident wave is inputted to one end of the first transmission line 21. The first reflected wave generated by the impedance mismatch of the first transmission line 21 at the position of magnetic field application is inputted to the signal detector 12 via the port P1 and the DC 15-1. In this way, the signal detector 12 detects the first reflected wave from one end of the first transmission line 21.

In a case in which the signal generator 11 outputs the first incident wave to the DC 15-2, for example, the first incident wave is inputted to the other end of the first transmission line 21. The first reflected wave generated by the impedance mismatch of the first transmission line 21 at the position of magnetic field application is inputted to the signal detector 12 via the port P2 and the DC 15-2. In this way, the signal detector 12 detects the first reflected wave from the other end of the first transmission line 21.

In a case in which the signal generator 11 outputs the second incident wave to the DC 15-3, for example, the second incident wave is inputted to one end of the second transmission line 22. The second reflected wave generated by the impedance mismatch of the second transmission line 22 at the position of magnetic field application is inputted to the signal detector 12 via the port P3 and the DC 15-3. In this way, the signal detector 12 detects the second reflected wave from one end of the second transmission line 22.

In a case in which the signal generator 11 outputs the second incident wave to the DC 15-4, for example, the second incident wave is inputted to the other end of the second transmission line 22. The second reflected wave generated by the impedance mismatch of the second transmission line 22 at the position of magnetic field application is inputted to the signal detector 12 via the port P4 and the DC 15-4. In this way, the signal detector 12 detects the second reflected wave from the other end of the second transmission line 22.

The signal detector 12 detects the vector ratio of the reflected wave to the incident wave for each frequency of the sinusoidal signal swept and outputted by the signal generator 11. As used here, the vector ratio is a vector defined by the reflectance and phase difference of the reflected wave relative to the incident wave. The reflectance of the reflected wave relative to the incident wave is the amplitude of the reflected wave divided by the amplitude of the incident wave. The phase difference of the reflected wave relative to the incident wave is the phase of the reflected wave minus the phase of the incident wave.

The signal detector 12 outputs the vector ratio of the first reflected wave to the first incident wave for each frequency of the first incident wave as frequency domain data to the controller 13. Also, the signal detector 12 outputs the vector ratio of the second reflected wave to the second incident wave for each frequency of the second incident wave as frequency domain data to the controller 13.

The controller 13 controls each component of the measurement apparatus 10. The controller 13 may be configured as a processor, such as a central processing unit (CPU). Details on the functions of the controller 13 are provided below.

The memory 14 is connected to the controller 13. The memory 14 may include any storage apparatus, such as a hard disk drive (HDD), a solid state drive (SSD), an electrically erasable programmable read-only memory (EEPROM), a read-only memory (ROM), a random access memory (RAM), or the like. The memory 14 may, for example, function as a main storage apparatus, an auxiliary memory apparatus, or a cache memory. The memory 14 is not limited to being internal to the measurement apparatus 10 and may be an external storage apparatus connected through a digital input/output port or the like, such as Universal Serial Bus (USB).

The controller 13 performs an inverse Fourier transform on the frequency domain data on the vector ratio of the first reflected wave to the first incident wave, acquired from the signal detector 12, to generate the time domain data on the first reflected wave. The controller 13 also performs an inverse Fourier transform on the frequency domain data on the vector ratio of the second reflected wave to the second incident wave, acquired from the signal detector 12, to generate the time domain data on the second reflected wave.

The controller 13 acquires the first incident wave outputted by the signal generator 11 via the signal detector 12 and performs an inverse Fourier transform to generate time domain data on the first incident wave. The controller 13 can calculate the position of magnetic field application in the first transmission line 21 based on the time domain data on the first incident wave and the time domain data on the first reflected wave. The controller 13 can calculate the position of the magnetic field application in the first transmission line 21 based on the difference between the time at which the time domain data on the first incident wave is detected and the time at which the time domain data on the first reflected wave is detected.

The controller 13 can also calculate the intensity of the magnetic field at the position of magnetic field application to the first transmission line 21 based on the time domain data on the first incident wave and the time domain data on the first reflected wave. If the intensity of the magnetic field at the position of magnetic field application to the first transmission line 21 is large, the impedance mismatch at that position of magnetic field application increases. Therefore, if the intensity of the magnetic field at the position of magnetic field application to the first transmission line 21 increases, the ratio of the magnitude of the amplitude in the time domain data on the first reflected wave to the magnitude of the amplitude in the time domain data on the first incident wave increases. The controller 13 can therefore calculate the intensity of the magnetic field at the position of magnetic field application based on the ratio of the magnitude of the amplitude in the time domain data on the first reflected wave to the magnitude of the amplitude in the time domain data on the first incident wave. The intensity of the magnetic field at the position of magnetic field application to the first transmission line 21 calculated here by the controller 13 is the intensity of the magnetic field in the direction along the first transmission line 21. Thus, the controller 13 can simultaneously calculate the position of magnetic field application in the first transmission line 21 and the intensity of the magnetic field at the position of magnetic field application in the first transmission line 21 by, for example, the method described in PTL 1.

The controller 13 acquires the second incident wave outputted by the signal generator 11 via the signal detector 12 and performs an inverse Fourier transform to generate time domain data on the second incident wave. The controller 13 can calculate the position of magnetic field application in the second transmission line 22 based on the time domain data on the second incident wave and the time domain data on the second reflected wave. The controller 13 can calculate the position of the magnetic field application in the second transmission line 22 based on the difference between the time at which the time domain data on the second incident wave is detected and the time at which the time domain data on the second reflected wave is detected.

The controller 13 can also calculate the intensity of the magnetic field at the position of magnetic field application to the second transmission line 22 based on the time domain data on the second incident wave and the time domain data on the second reflected wave. If the intensity of the magnetic field at the position of magnetic field application to the second transmission line 22 is large, the impedance mismatch at that position of magnetic field application increases. Therefore, if the intensity of the magnetic field at the position of magnetic field application to the second transmission line 22 increases, the ratio of the magnitude of the amplitude in the time domain data on the second reflected wave to the magnitude of the amplitude in the time domain data on the second incident wave increases. The controller 13 can therefore calculate the intensity of the magnetic field at the position of magnetic field application based on the ratio of the magnitude of the amplitude in the time domain data on the second reflected wave to the magnitude of the amplitude in the time domain data on the second incident wave. The intensity of the magnetic field at the position of magnetic field application to the second transmission line 22 calculated here by the controller 13 is the intensity of the magnetic field in the direction along the second transmission line 22. Thus, the controller 13 can simultaneously calculate the position of magnetic field application in the second transmission line 22 and the intensity of the magnetic field at the position of magnetic field application in the second transmission line 22 by, for example, the method described in PTL 1.

The controller 13 calculates a biaxial magnetic field based on the magnetic field in the direction along the first transmission line 21 and the magnetic field in the direction along the second transmission line 22, calculated as described above. The calculation of a biaxial magnetic field by the controller 13 is explained with reference to FIGS. 3 to 6.

Figure 3:
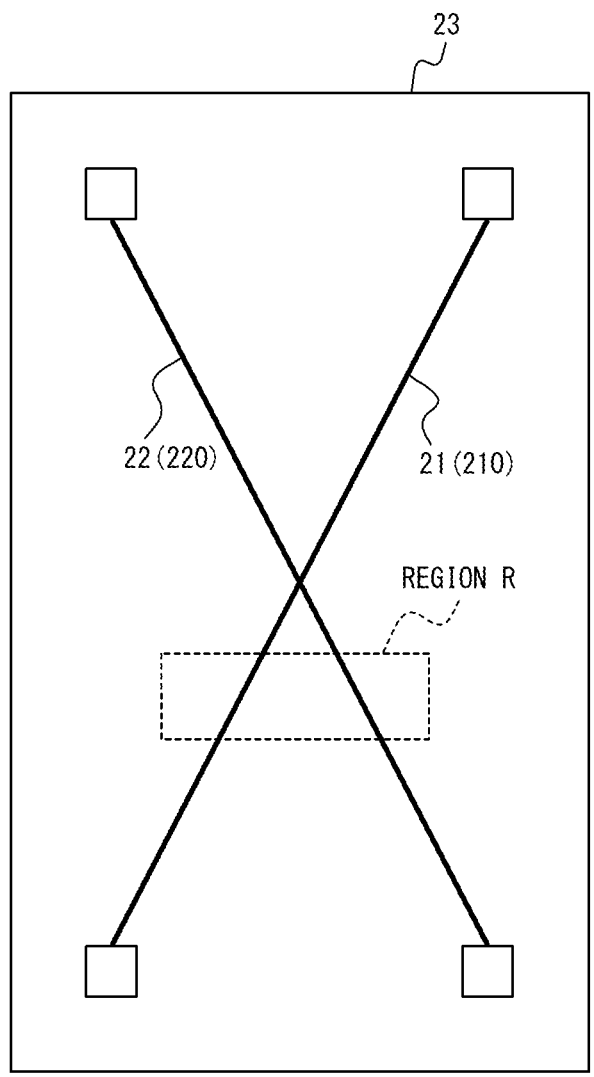
FIG. 3 is a diagram illustrating a schematic configuration of a magnetic sensor apparatus according to an embodiment.

FIG. 3 is a diagram illustrating a schematic configuration of the magnetic sensor 20. As illustrated in FIG. 3, the longitudinal direction of the substrate 23 is assumed to be the Y-axis direction, and the transverse direction of the substrate 23 is assumed to be the X-axis direction. The case of a uniform magnetic field H being applied externally in the region R indicated on the substrate 23 in FIG. 3 is described as an example.

Figure 4:
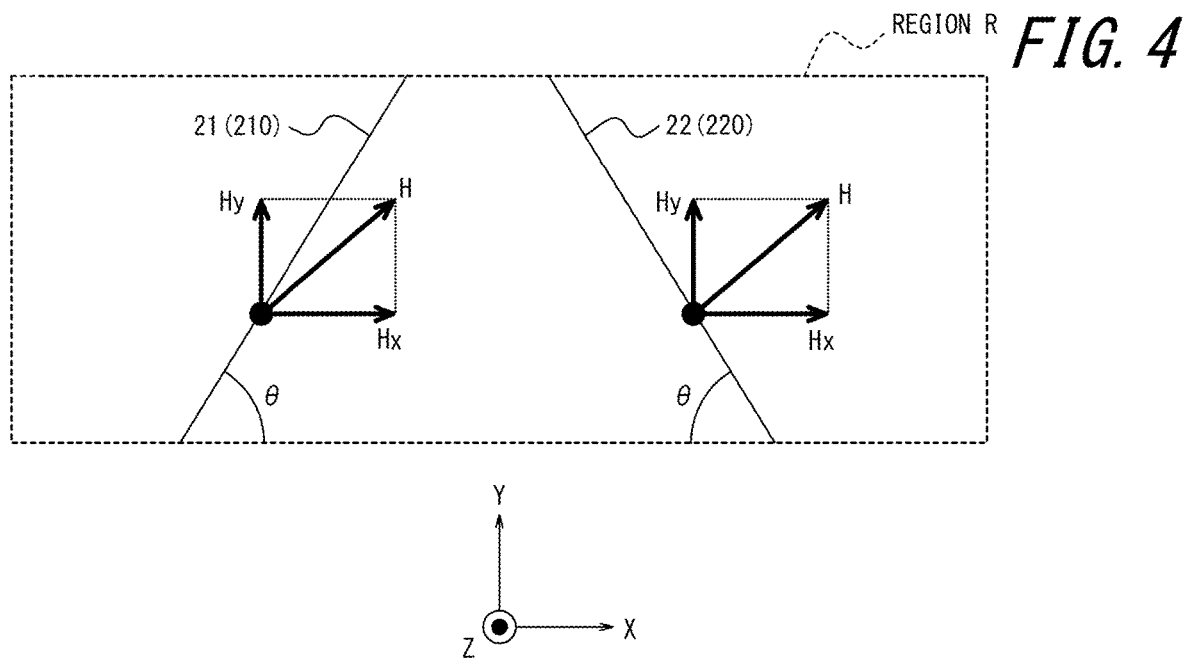
FIG. 4 is a diagram illustrating a magnetic field being applied to the magnetic sensor.

FIG. 4 is an enlarged view of the region R illustrated in FIG. 3. As illustrated in FIG. 4, it is assumed that a uniform magnetic field H is externally applied to the region R. The magnetic field H can be subjected to vector decomposition into a biaxial magnetic field, i.e., a magnetic field $H_x$ in the x-axis direction and a magnetic field $H_y$ in the y-axis direction.

FIG. 4 illustrates a case in which the first transmission line 21 lies in a direction of angle θ from the positive direction of the X axis, and the second transmission line 22 lies in a direction of angle θ from the negative direction of the X axis.

Figure 5:
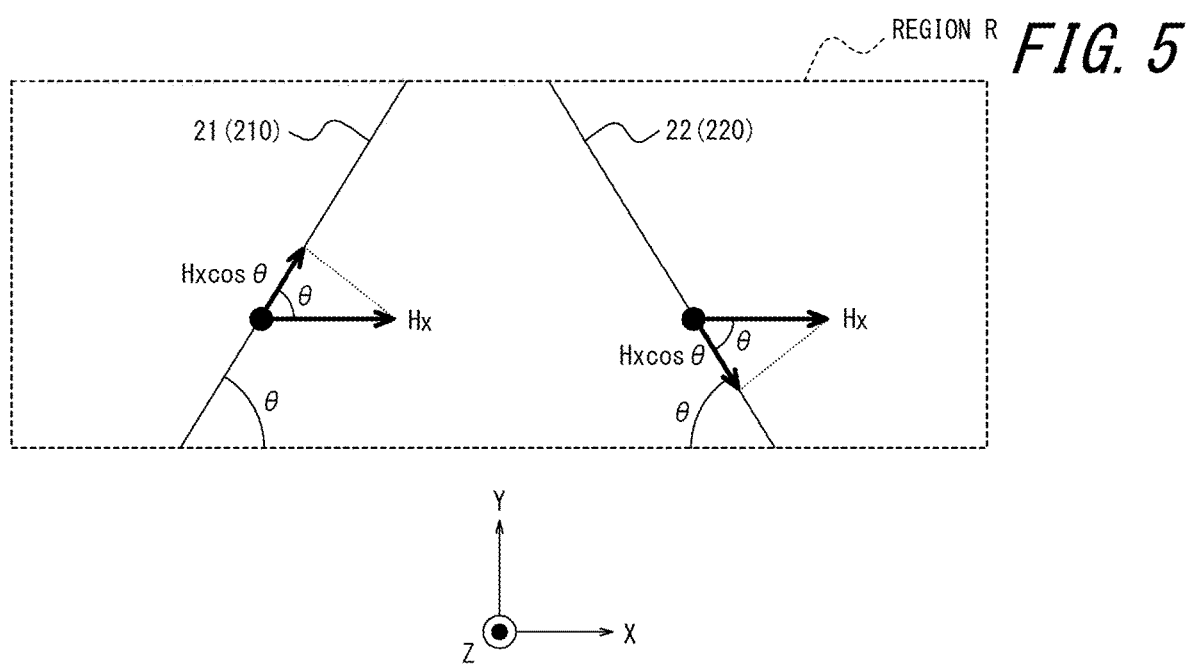
FIG. 5 is a diagram illustrating means for calculating a biaxial magnetic field.

FIG. 5 illustrates the magnetic field $H_x$ subjected to vector decomposition in the direction along the first transmission line 21 and the magnetic field $H_x$ subjected to vector decomposition in the direction along the second transmission line 22.

As illustrated in FIG. 5, the magnitude of the component of the magnetic field $H_x$ subjected to vector decomposition in the direction along the first transmission line 21 is $H_x \cos θ$. The magnitude of the component of the magnetic field $H_x$ subjected to vector decomposition in the direction along the second transmission line 22 is $H_x \cos θ$.

Figure 6:
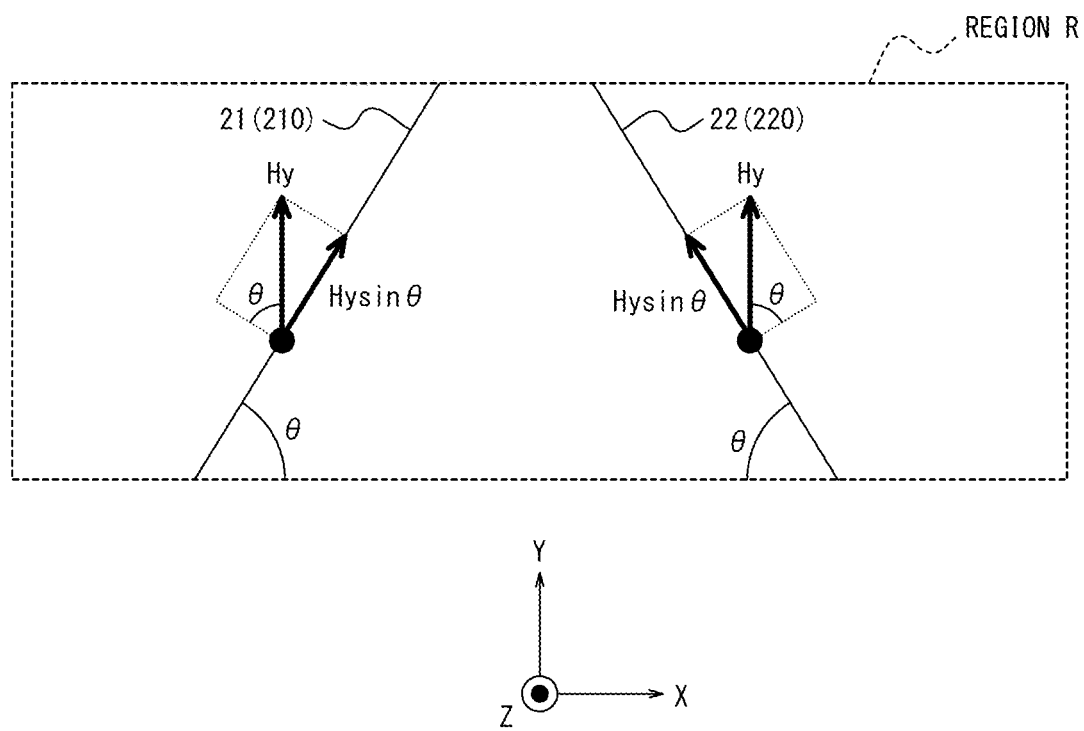
FIG. 6 is a diagram illustrating means for calculating a biaxial magnetic field.

FIG. 6 illustrates the magnetic field $H_y$ subjected to vector decomposition in the direction along the first transmission line 21 and the magnetic field $H_y$ subjected to vector decomposition in the direction along the second transmission line 22.

As illustrated in FIG. 6, the magnitude of the component of the magnetic field $H_y$ subjected to vector decomposition in the direction along the first transmission line 21 is $H_y \sin θ$. The magnitude of the component of the magnetic field $H_y$ subjected to vector decomposition in the direction along the second transmission line 22 is $H_y \sin \theta$.

Letting the magnetic field in the direction along the first transmission line 21 be magnetic field H 1, the magnetic field $H_1$ can be represented by Equation (1) below by combining the magnetic field vectors illustrated in FIGS. 5 and 6.

$$H_1 = H_x \cos \theta + H_y \sin \theta \tag{1}$$

Letting the magnetic field in the direction along the second transmission line 22 be magnetic field $H_2$, the magnetic field $H_2$ can be represented by Equation (2) below by combining the magnetic field vectors illustrated in FIGS. 5 and 6. In Equation (2), the first term on the right side, $H_x \cos \theta$, has a negative sign indicating that the vector is opposite in direction to the second term on the right side, $H_y \sin \theta$.

$$H_2 = -H_x \cos \theta + H_y \sin \theta \tag{2}$$

Hereinafter, the magnetic field $H_1$ in the direction along the first transmission line 21 may be referred to as the "first magnetic field". The magnetic field. $H_2$ in the direction along the second transmission line 22 may hereinafter be referred to as the "second magnetic field".

Based on Equations (1) and (2), the magnetic field $H_x$ in the X-axis direction and the magnetic field $H_y$ in the Y-axis direction can respectively be calculated as follows.

$$H_x = \frac{1}{2 \cos \theta} \times (H_1 - H_2) \tag{3}$$

$$H_y = \frac{1}{2 \sin \theta} \times (H_1 + H_2) \tag{4}$$

The controller 13 calculates the first magnetic field $H_1$ in the direction along the first transmission line 21 based on the first incident wave and the first reflected wave and calculates the second magnetic field $H_2$ in the direction along the second transmission line 22 based on the second incident wave and the second reflected wave. The controller 13 performs calculations as illustrated in Equations (3) and (4) based on the first magnetic field $H_1$ and the second magnetic field $H_2$ and can thereby calculate a biaxial magnetic field, i.e., the magnetic field $H_x$ in the X-axis direction and the magnetic field $H_y$ in the Y-axis direction.

In this way, using the first transmission line 21 and the second transmission line 22 arranged to be non-parallel to each other, the magnetic detection apparatus 1 can detect the first magnetic field $H_1$ in the direction along the first transmission line 21 and the second magnetic field $H_2$ in the direction along the second transmission line 22. The magnetic detection apparatus 1 can then calculate a biaxial magnetic field, i.e. the magnetic field $H_x$ in the X-axis direction and the magnetic field $H_y$ in the Y-axis direction, based on the first magnetic field $H_1$ and the second magnetic field $H_2$.

(Offset Data)

When calculating the first magnetic field and the second magnetic field based on the first reflected wave and the second reflected wave, the measurement apparatus 10 may, as the data on the first reflected wave and the second reflected wave used for calculating the first magnetic field and the second magnetic field, use data on the difference obtained by subtracting offset data. The measurement apparatus 10 may store the data on the first and second reflected waves detected when no magnetic field is applied to the first transmission line 21 and the second transmission line 22 as offset data in the memory 14. By thus using the data on the difference, obtained by subtracting the offset data from the data on the detected first and second reflected wave, as the data on the first and second reflected wave for calculating the first and second magnetic fields, the measurement apparatus 10 can calculate the first and second magnetic fields while reducing effects other than the external magnetic field. For example, the measurement apparatus 10 can reduce the effects of factors such as the mechanical tolerance of the constituent elements of the first transmission line 21 and the second transmission line 22, the distortion caused by bending or the like of the first transmission line 21 and the second transmission line 22, and the reflected wave caused by an environmental magnetic field (for example, magnetic fields generated by geomagnetism or electronic devices) or the like applied from the initial state.

(Application of Bias Magnetic Field)

The magnetic detection apparatus 1 may include a coil around the first transmission line 21 and the second transmission line 22. The magnetic detection apparatus 1 can apply a bias magnetic field in the direction along the first transmission line 21 and the second transmission line 22 by passing a bias current through the coil installed around the first transmission line 21 and the second transmission line 22.

By applying the bias magnetic field as described above, the measurement apparatus 10 can calculate the first magnetic field and second magnetic field at operating points that exhibit high linearity, small hysteresis, and high sensitivity. The measurement apparatus 10 can thereby calculate a biaxial magnetic field with high accuracy.

According to the magnetic detection apparatus 1 of the above embodiment, biaxial magnetic fields can be detected. In greater detail, the magnetic sensor 20 includes the first transmission line 21 and the second transmission line 22, and the first transmission line 21 and the second transmission line 22 are arranged to be non-parallel to each other. The controller 13 of the measurement apparatus 10 calculates the first magnetic field in the direction along the first transmission line 21 at the position of magnetic field application based on the first incident wave and the first reflected wave, calculates the second magnetic field in the direction along the second transmission line 22 at the position of magnetic field application based on the second incident wave and the second reflected wave, and calculates a biaxial magnetic field based on the first magnetic field and the second magnetic field. By the magnetic sensor 20 thus including the first transmission line 21 and the second transmission line 22 arranged to be non-parallel to each other, the magnetic detection apparatus 1 can calculate the biaxial magnetic field based on the first magnetic field detected on the first transmission line 21 and the second magnetic field detected on the second transmission line 22.

According to the magnetic detection apparatus 1 of an embodiment, the position of the magnetic field applied to the magnetic sensor 20 and the intensity of the magnetic field applied to the magnetic sensor 20 can be detected simultaneously, thus enabling detection of non-uniform external magnetic fields generated by the measurement target. The magnetic detection apparatus 1 can therefore measure external magnetic fields generated by the magnetization distribution of the magnetic material to be measured, external magnetic fields generated by the magnetic field distribution due to defects on the metal surface to be measured, and the like. The magnetic detection apparatus 1 is also applicable to a wide variety of measurement apparatuses, such as geomagnetic detection, eddy current testing, magnetic microscopes, current sensors, and magnetoencephalography.

(First Variation)

FIG. 7 is a diagram illustrating a magnetic sensor 20a according to a first variation. The magnetic sensor 20a illustrated in FIG. 7 has a first transmission line 21a formed on the front surface of the substrate 23. A second transmission line 22a is formed on the back surface of the substrate 23.

In FIG. 7, only the first transmission line 21a is illustrated on the left side, with a depiction of the second transmission line 22a omitted, to make the shape of the first transmission line 21a easier to see.

Only the second transmission line 22a is illustrated on the right side, with a depiction of the first transmission line 21a omitted, to make the shape of the second transmission line 22a easier to see.

Both the diagram illustrating only the first transmission line 21a, on the left side, and the diagram illustrating only the second transmission line 22a, on the right side, are viewed from the positive side of the Z axis. The second transmission line 22a is on the back surface of the substrate 23 and is therefore illustrated by dashed lines.

The magnetic sensor 20a according to the first variation is shaped with the substrate 23 extended in the longitudinal direction (Y-axis direction) to increase the range over which the magnetic sensor 20a can detect magnetic fields.

For example, in the magnetic sensor 20 illustrated in FIG. 3, if the substrate 23 were extended in the Y-axis direction while maintaining the angle illustrated in FIG. 4, the length of the substrate 23 in the X-axis direction would also increase. Consequently, the magnetic sensor 20 would also be extended in the X-axis direction, and the shape of magnetic sensor 20 would end up increasing.

If the angle θ illustrated in FIG. 4 were set close to 90° and the substrate 23 were extended in the Y-axis direction to prevent the shape of the magnetic sensor 20 from becoming larger, the sensitivity to magnetic fields in the X-axis direction would be reduced.

The magnetic sensor 20a according to the first variation has a configuration that enables the substrate 23 to be extended in the Y-axis direction without increasing the length of the substrate 23 in the X-axis direction and without reducing the sensitivity to magnetic fields in the X-axis direction.

As illustrated on the left side of FIG. 7, the first transmission line 21a includes a plurality of first conductors 210. The first conductors 210 are linear conductors containing magnetic material. Adjacent first conductors 210 are connected to each other by a conductor 211 made of non-magnetic material. The conductors 211 made of non-magnetic material may, for example, be a copper wire. The conductors 211 made of non-magnetic material are arranged along the transverse direction (X-axis direction) of the substrate 23. The first transmission line 21a has a serrated shape overall.

In FIG. 7, the first transmission line 21a includes five first conductors 210, but this is just one example. The first transmission line 21a may include two to four first conductors 210, or six or more first conductors 210.

As illustrated on the right side of FIG. 7, the second transmission line 22a includes a plurality of second conductors 220. The second conductors 220 are linear conductors containing magnetic material. Adjacent second conductors 220 are connected to each other by a conductor 221 made of non-magnetic material. The conductors 221 made of non-magnetic material may, for example, be a copper wire. The conductors 221 made of non-magnetic material are arranged along the transverse direction (X-axis direction) of the substrate 23. The second transmission line 22a has a serrated shape overall.

In FIG. 7, the second transmission line 22a includes five second conductors 220, but this is just one example. The second transmission line 22a may include two to four second conductors 220, or six or more second conductors 220.

As illustrated in FIG. 7, the plurality of first conductors 210 and the second conductors 220 are arranged to be non-parallel to each other. Accordingly, even if the magnetic sensor 20a according to the first variation is used instead of the magnetic sensor 20 in the magnetic detection apparatus 1 illustrated in FIG. 1, the magnetic detection apparatus 1 can calculate a biaxial magnetic field.

As a result of the first transmission line 21a and the second transmission line 22a having a serrated shape, the magnetic sensor 20a according to the first variation enables the substrate 23 to be extended in the Y-axis direction without increasing the length of the substrate 23 in the X-axis direction and without reducing the sensitivity to magnetic fields in the X-axis direction.

Therefore, the magnetic sensor 20a according to the first variation can extend the range where the magnetic sensor 20a can detect magnetic fields in the Y-axis direction without increasing the length of the substrate 23 in the X-axis direction and without reducing the sensitivity to magnetic fields in the X-axis direction.

In FIG. 7, the first transmission line 21a is formed on the front surface of the substrate 23, and the second transmission line 22a is formed on the back surface of the substrate 23, but this configuration is not limiting. For example, in a case in which the substrate 23 is a multilayer substrate, the first transmission line 21a and the second transmission line 22b may be formed in different layers of the substrate 23.

(Second Variation)

FIG. 8 is a diagram illustrating a magnetic sensor 20b according to a second variation. The magnetic sensor 20b according to the second variation is mainly described in terms of the differences from the magnetic sensor 20a according to the first variation illustrated in FIG. 7, and a description of portions identical or similar to the magnetic sensor 20a is omitted.

As illustrated on the left side of FIG. 8, the first transmission line 21b includes a plurality of first conductors 210. Adjacent first conductors 210 are connected to each other by a conductor 211 made of non-magnetic material. The conductors 211 made of non-magnetic material are arranged in a diagonal direction with respect to the transverse direction (X-axis direction) of the substrate 23, unlike the conductors 211 illustrated on the left side of FIG. 7. The first transmission line 21b has a serrated shape overall.

As illustrated on the right side of FIG. 8, the second transmission line 22b includes a plurality of second conductors 220. Adjacent second conductors 220 are connected to each other by a conductor 221 made of non-magnetic material. The conductors 221 made of non-magnetic material are arranged in a diagonal direction with respect to the transverse direction (X-axis direction) of the substrate 23, unlike the conductors 221 illustrated on the right side of FIG. 7. The second transmission line 22b has a serrated shape overall.

As can be seen in the left side of FIG. 8, two adjacent first conductors 210 in the plurality of first conductors 210 have an overlapping region S in the longitudinal direction (Y-axis direction) of the magnetic sensor 20b.

By thus having the overlapping region S, the first transmission line 21b can detect magnetic fields at all positions in the Y-axis direction. Similarly, by having the overlapping region S, the second transmission line 22b can detect magnetic fields at all positions in the Y-axis direction.

For example, as can be seen in the left side of FIG. 7, in the magnetic sensor 20a according to the first variation, the first transmission line 21a includes a plurality of first conductors 210, and adjacent first conductors 210 are connected to each other by a conductor 211 made of non-magnetic material. In this case, the first conductor 210 and the conductor 211 are connected via a pad, but the portion corresponding to the pad is a region with no first conductor 210 in the Y-axis direction. In other words, this region may be less sensitive to external magnetic fields.

The magnetic sensor 20b according to the second variation can prevent the existence of such regions that may be less sensitive to external magnetic fields.

It will be clear to a person of ordinary skill in the art that the present disclosure may be implemented in certain ways other than the above embodiments without departing from the spirit or essential features thereof. Accordingly, the above explanation merely provides examples that are in no way limiting. The scope of the present disclosure is to be defined by the appended claims, not by the above explanation. Among all changes, various changes that are within the range of equivalents are included therein.

For example, the arrangement, number, and the like of the above-described components are not limited to the above explanation or the drawings. The arrangement, number, and the like of each component may be selected freely as long as the functions of the component can be achieved.

For example, in the embodiment described above, the case of providing one each of the first transmission line 21 and the second transmission line 22 has been described as an example, but the number of first transmission lines 21 and second transmission lines 22 is not limited to this example. The magnetic sensor 20 may have a plurality of first transmission lines 21 arranged parallel to each other and connected in parallel. The magnetic sensor 20 may also have a plurality of second transmission lines 22 arranged parallel to each other and connected in parallel. In this case, the plurality of first transmission lines 21 and the plurality of second transmission lines 22 are arranged to be non-parallel to each other. In a case in which permalloy is used as the linear first conductor 210 and the linear second conductor 220, the volume resistivity of the permalloy is approximately 68 μΩcm. This is more than 40 times the volume resistivity of copper, which is 1.68 μΩcm. Furthermore, since the maximum magnetic permeability of permalloy is very high, the resistive loss due to the skin effect during high-frequency input is large, resulting in the problem of large attenuation. If the magnetic sensor 20 is configured to include a plurality of first transmission lines 21 and a plurality of second transmission lines 22, the resistive loss due to the first conductor 210 and the second conductor 220 can be reduced.

For example, in the above embodiment, the case in which the signal generator 11 outputs a sinusoidal signal while sweeping the frequency has been described as an example, but the waveform generated by the signal generator 11 is not limited to this example. For example, the signal generator 11 may generate pulses to be inputted to the first transmission line 21 and the second transmission line 22.

Some embodiments of the present disclosure are exemplified below. It should be noted that the embodiments of the present disclosure are not, however, limited to these examples.

[Appendix 1]

A magnetic detection apparatus comprising a magnetic sensor and a measurement apparatus, wherein
the magnetic sensor comprises
at least one first transmission line including at least one linear first conductor containing magnetic material; and
at least one second transmission line including at least one linear second conductor containing magnetic material,
the first transmission line and the second transmission line are arranged to be non-parallel to each other,
the measurement apparatus comprises
a signal generator configured to generate a first incident wave to be inputted to the first transmission line and a second incident wave to be inputted to the second transmission line;
a signal detector configured to detect a first reflected wave caused by an impedance mismatch of the first transmission line at a position of magnetic field application to the magnetic sensor and a second reflected wave caused by an impedance mismatch of the second transmission line at the position of magnetic field application; and
a controller, and
the controller is configured to
calculate a first magnetic field in a direction along the first transmission line at the position of magnetic field application based on the first incident wave and the first reflected wave,
calculate a second magnetic field in a direction along the second transmission line at the position of magnetic field application based on the second incident wave and the second reflected wave, and
calculate a biaxial magnetic field based on the first magnetic field and the second magnetic field.

[Appendix 2]

The magnetic detection apparatus according to appendix 1, wherein in the magnetic sensor,
the at least one first transmission line comprises a plurality of first transmission lines arranged in parallel with each other, and
the at least one second transmission line comprises a plurality of second transmission lines arranged in parallel with each other, and
the plurality of first transmission lines and the plurality of second transmission lines are arranged to be non-parallel to each other.

[Appendix 3]

The magnetic detection apparatus according to appendix 1 or 2, wherein the first transmission line and the second transmission line are one of a coaxial cable, a parallel two-wire line, a strip line, a microstrip line, a coplanar line, and a waveguide.

[Appendix 4]

The magnetic detection apparatus according to any one of appendices 1 to 3, wherein
the at least one first conductor in the first transmission line comprises a plurality of first conductors,
the plurality of first conductors are connected by at least one conductor of non-magnetic material,
the first transmission line has a serrated shape, the at least one second conductor in the second transmission line comprises a plurality of second conductors, the plurality of second conductors are connected by at least one conductor of non-magnetic material, the second transmission line has a serrated shape, and the plurality of first conductors and the plurality of second conductors are arranged to be non-parallel to each other.

[Appendix 5]

The magnetic detection apparatus according to appendix 4, wherein two adjacent first conductors among the plurality of first conductors have an overlapping region in a longitudinal direction of the magnetic sensor, and two adjacent second conductors among the plurality of second conductors have an overlapping region in the longitudinal direction of the magnetic sensor.

[Appendix 6]

The magnetic detection apparatus according to any one of appendices 1 to 5, further comprising a coil configured to apply a bias magnetic field to the first transmission line and the second transmission line.

[Appendix 7]

A magnetic sensor comprising:

a first transmission line including a linear first conductor containing magnetic material; and a second transmission line including a linear second conductor containing magnetic material, wherein the first transmission line and the second transmission line are arranged to be non-parallel to each other.

[Appendix 8]

A magnetic detection method for a magnetic detection apparatus comprising a magnetic sensor and a measurement apparatus, the magnetic sensor comprising a first transmission line including a linear first conductor containing magnetic material; and a second transmission line including a linear second conductor containing magnetic material, the first transmission line and the second transmission line being arranged to be non-parallel, the magnetic detection method comprising:

generating, by the measurement apparatus, a first incident wave to be inputted to the first transmission line and a second incident wave to be inputted to the second transmission line;

detecting, by the measurement apparatus, a first reflected wave caused by an impedance mismatch of the first transmission line at a position of magnetic field application to the magnetic sensor and a second reflected wave caused by an impedance mismatch of the second transmission line at the position of magnetic field application;

calculating, by the measurement apparatus, a first magnetic field in a direction along the first transmission line at the position of magnetic field application based on the first incident wave and the first reflected wave;

calculating, by the measurement apparatus, a second magnetic field in a direction along the second transmission line at the position of magnetic field application based on the second incident wave and the second reflected wave; and calculating, by the measurement apparatus, a biaxial magnetic field based on the first magnetic field and the second magnetic field.

The invention claimed is:

1. A magnetic detection apparatus comprising a magnetic sensor and a measurement apparatus, wherein the magnetic sensor comprises at least one first transmission line including at least one linear first conductor containing magnetic material; and at least one second transmission line including at least one linear second conductor containing magnetic material, the first transmission line and the second transmission line are arranged to be non-parallel to each other, the measurement apparatus comprises a signal generator configured to generate a first incident wave to be inputted to the first transmission line and a second incident wave to be inputted to the second transmission line;

a signal detector configured to detect a first reflected wave caused by an impedance mismatch of the first transmission line at a position of magnetic field application to the magnetic sensor and a second reflected wave caused by an impedance mismatch of the second transmission line at the position of magnetic field application; and a controller, and the controller is configured to calculate a first magnetic field in a direction along the first transmission line at the position of magnetic field application based on the first incident wave and the first reflected wave, calculate a second magnetic field in a direction along the second transmission line at the position of magnetic field application based on the second incident wave and the second reflected wave, and calculate a biaxial magnetic field based on the first magnetic field and the second magnetic field, wherein the at least one first conductor in the first transmission line comprises a plurality of first conductors, the plurality of first conductors are connected by at least one conductor of non-magnetic material, the plurality of first conductors of the first transmission line are arranged in a serrated manner, the at least one second conductor in the second transmission line comprises a plurality of second conductors, the plurality of second conductors are connected by at least one conductor of non-magnetic material, the plurality of second conductors of the second transmission line are arranged in a serrated manner, and the plurality of first conductors and the plurality of second conductors are arranged to be non-parallel to each other.

2. The magnetic detection apparatus according to claim 1, wherein in the magnetic sensor, the at least one first transmission line comprises a plurality of first transmission lines arranged in parallel with each other, and the at least one second transmission line comprises a plurality of second transmission lines arranged in parallel with each other, and the plurality of first transmission lines and the plurality of second transmission lines are arranged to be non-parallel to each other.

3. The magnetic detection apparatus according to claim 1, wherein the first transmission line and the second transmission line are one of a coaxial cable, a parallel two-wire line, a strip line, a microstrip line, a coplanar line, and a waveguide.

4. The magnetic detection apparatus according to claim 1, wherein
two adjacent first conductors among the plurality of first conductors have an overlapping region in a longitudinal direction of the magnetic sensor, and
two adjacent second conductors among the plurality of second conductors have an overlapping region in the longitudinal direction of the magnetic sensor.

5. The magnetic detection apparatus according to claim 1, further comprising a coil configured to apply a bias magnetic field to the first transmission line and the second transmission line.

6. A magnetic sensor comprising:
a first transmission line including a linear first conductor containing magnetic material; and
a second transmission line including a linear second conductor containing magnetic material, wherein
the first transmission line and the second transmission line are arranged to be non-parallel to each other,
the at least one first conductor in the first transmission line comprises a plurality of first conductors,
the plurality of first conductors are connected by at least one conductor of non-magnetic material,
the plurality of first conductors of the first transmission line are arranged in a serrated manner,
the at least one second conductor in the second transmission line comprises a plurality of second conductors,
the plurality of second conductors are connected by at least one conductor of non-magnetic material,
the plurality of second conductors of the second transmission line are arranged in a serrated manner, and
the plurality of first conductors and the plurality of second conductors are arranged to be non-parallel to each other.

7. A magnetic detection method for a magnetic detection apparatus comprising a magnetic sensor and a measurement apparatus,
the magnetic sensor comprising
a first transmission line including a linear first conductor containing magnetic material; and
a second transmission line including a linear second conductor containing magnetic material,
the first transmission line and the second transmission line being arranged to be non-parallel,
the magnetic detection method comprising:
generating, by the measurement apparatus, a first incident wave to be inputted to the first transmission line and a second incident wave to be inputted to the second transmission line;
detecting, by the measurement apparatus, a first reflected wave caused by an impedance mismatch of the first transmission line at a position of magnetic field application to the magnetic sensor and a second reflected wave caused by an impedance mismatch of the second transmission line at the position of magnetic field application;
calculating, by the measurement apparatus, a first magnetic field in a direction along the first transmission line at the position of magnetic field application based on the first incident wave and the first reflected wave;
calculating, by the measurement apparatus, a second magnetic field in a direction along the second transmission line at the position of magnetic field application based on the second incident wave and the second reflected wave; and
calculating, by the measurement apparatus, a biaxial magnetic field based on the first magnetic field and the second magnetic field, wherein
the at least one first conductor in the first transmission line comprises a plurality of first conductors,
the plurality of first conductors are connected by at least one conductor of non-magnetic material,
the plurality of first conductors of the first transmission line are arranged in a serrated manner,
the at least one second conductor in the second transmission line comprises a plurality of second conductors,
the plurality of second conductors are connected by at least one conductor of non-magnetic material,
the plurality of second conductors of the second transmission line are arranged in a serrated manner, and
the plurality of first conductors and the plurality of second conductors are arranged to be non-parallel to each other.

8. The magnetic detection apparatus according to claim 1, wherein the plurality of first conductors and the plurality of second conductors are arranged symmetrically to each other.

* * * * *